United States Patent
Ohkuma et al.

(10) Patent No.: US 7,282,243 B2
(45) Date of Patent: Oct. 16, 2007

(54) PATTERN FORMING METHOD AND METHOD OF MANUFACTURING INK JET RECORDING HEAD

(75) Inventors: Norio Ohkuma, Tokyo (JP); Hikaru Ueda, Kawasaki (JP); Maki Hatta, Tokyo (JP); Masaki Ohsumi, Yokosuka (JP); Takayuki Ono, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/295,553

(22) Filed: Dec. 7, 2005

(65) Prior Publication Data

US 2006/0127813 A1   Jun. 15, 2006

(30) Foreign Application Priority Data

Dec. 9, 2004   (JP) .............................. 2004-356784

(51) Int. Cl.
*C08F 2/50* (2006.01)
(52) U.S. Cl. ...................... 427/510; 427/517; 427/272; 430/422; 430/269
(58) Field of Classification Search ...................... None
See application file for complete search history.

(56) References Cited

U.S. PATENT DOCUMENTS

| | | | |
|---|---|---|---|
| 5,730,889 A | 3/1998 | Miyagawa et al. | |
| 6,139,761 A | 10/2000 | Ohkuma | |
| 6,305,080 B1 | 10/2001 | Komuro et al. | |
| 6,455,112 B1 | 9/2002 | Ohkuma et al. | |
| 6,530,641 B2 | 3/2003 | Ohashi et al. | |
| 6,766,579 B2 | 7/2004 | Ohkuma | |
| 6,895,668 B2 | 5/2005 | Imamura | |
| 7,008,552 B2 | 3/2006 | Ohkuma | |
| 2006/0125884 A1 | 6/2006 | Sato et al. | |
| 2006/0132539 A1 | 6/2006 | Hino et al. | |
| 2006/0221133 A1 | 10/2006 | Harada et al. | |
| 2006/0230614 A1 | 10/2006 | Imamura et al. | |
| 2006/0277755 A1 | 12/2006 | Kubota et al. | |
| 2007/0017894 A1 | 1/2007 | Murayama et al. | |

FOREIGN PATENT DOCUMENTS

JP            6-286149           10/1994

*Primary Examiner*—William Phillip Fletcher, III
(74) *Attorney, Agent, or Firm*—Fitzpatrick, Cella, Harper & Scinto

(57) ABSTRACT

The present invention has as its object to provide a pattern forming method which, even if a pattern is formed by photolithography, can keep the edge of the opening portion of the pattern in a sharp state and yet, can make the wall surface of the recess of the pattern into a tapered shape, and a method of manufacturing an ink jet recording head to which the aforedescribed method is applied. The pattern forming method is a pattern forming method having the step of forming on a substrate a coat resin layer containing a photopolymerizable resin, the step of applying a solution containing a photopolymerization starting agent onto the coat resin layer, and forming the distribution of the density of the photopolymerization starting agent in the direction of film thickness of the coat resin layer, and the step of applying light from above the coat resin layer through a mask having a pattern depicted thereon, and the step of developing the coat resin layer to which the light has been applied to thereby make it into a coat resin layer having the pattern, and this method is applied to the manufacture of an ink jet recording head.

11 Claims, 2 Drawing Sheets

PATTERN FORMING METHOD AND METHOD OF MANUFACTURING INK JET RECORDING HEAD

BACKGROUND OF THE INVENTION

1. Field of the Invention

This invention relates to a pattern forming method by photolithography and a method of manufacturing an ink jet recording head to which the aforementioned method is applied.

2. Description of Related Art

In recent years, techniques of forming a three-dimensional structure of the order of micron which are typified by MEMS has been actively studied. As typical one of them, mention may be made of a method using a photosensitive resin capable of forming a pattern of a high aspect ratio. In the conventional method, however, it has been difficult to control the edge shape of a pattern opening portion and the taper angle of the wall surface of a pattern recess at a time. That, if the focus (imaging position) of the pattern by an exposing machine is set near the surface of a coat resin layer formed of the photosensitive resin, there can be obtained an edge shape in which the pattern opening portion is sharp, but it has been difficult to make the wall surface of the pattern recess into a tapered shape. Conversely, if the imaging position of the pattern by the exposing machine is offset (defocused) from the vicinity of the surface of the coat resin layer formed of the photosensitive resin, it becomes easy to make the wall surface of the pattern recess into a tapered shape, but it has been difficult to keep the pattern opening portion in a sharp edge shape.

Here, as an example of devices in which it is necessary to control the edge shape of the pattern opening portion and the taper angle of the wall surface of the pattern recess, mention may be made of the shape of the nozzle (ink discharge port) of an ink jet recording head in an ink jet recording system.

Heretofore, in the ink jet recording system, in order to made a recording characteristic higher in degree, there has been continued technical development for improvements in performance such as a smaller liquid droplet, a higher driving frequency and a greater member of nozzles. The applicant discloses, in Japanese Patent Application Laid-open No. H6-286149, a method of using a photosensitive material for a layer forming a nozzle, and realizing precise nozzle structure by photolithography technique as a method of manufacturing an ink jet recording head which satisfies the above-noted requirement.

The applicant further discloses, in U.S. Pat. No. 6,895,668, a manufacturing method of forming dry film or the like having photosensitivity as a nozzle surface processing material (a liquid repelling layer) on a material layer forming a nozzle.

Now, in the ink jet recording head, the taper angle of the nozzle greatly affects the discharging characteristic of ink in some cases, and generally it is regarded as being more advantageous to the discharging characteristic of ink to make the wall surface of the nozzle into a tapered shape. In the formation of a nozzle by photolithography, it is possible to defocus when pattern exposure is effected to thereby taper the nozzle. In the pattern exposure in the defocused state, however, there has been a case where the edge of the distal end of the nozzle (the opening portion of the ink discharge port) deviates from a proper focus and therefore tend to become rounded, and this has not been preferable in the discharging characteristic of ink.

SUMMARY OF THE INVENTION

This invention has been made in view of the above-noted points, and an object thereof is to provide a pattern forming method which, when forming a pattern by photolithography, can keep the edge of the opening portion of the pattern in a sharp state and yet, can make the wall surface of the recess of the pattern into a tapered shape. Also, an object of the present invention is to provide a method of manufacturing an ink jet recording head to which the afore described method is applied.

The present invention is a pattern forming method of forming a layer having a pattern on a substrate, having:

a) the step of forming a coat resin layer containing a photopolymerizable resin on said substrate:

b) the step of applying a solution containing a photopolymerization starting agent onto the coat resin layer, and forming the distribution of the density of the photopolymerization starting agent in the direction of film thickness of the coat resin layer;

c) the step of applying light from above the coat resin layer through a mask having a pattern depicted thereon; and d) the step of developing the coat resin layer to which the light has been applied to thereby make it into a coat resin layer having the pattern.

Also, the present invention in which the above-described method is applied to the manufacture of an ink jet recording head is a method of manufacturing an ink jet recording head, having:

A) the step of forming, on a substrate having an ink discharge pressure generating element formed thereon, a soluble resin layer having a pattern providing an ink flow path;

B) the step of forming a coat resin layer containing a photopolymerizable resin (i) on the substrate on which the soluble resin layer has been formed;

C) the step of forming a liquid repelling layer containing a photopolymerizable resin (ii) and a photopolymerization starting agent on the coat resin layer, and forming the distribution of the density of the photopolymerization starting agent in the direction of film thickness of the coat resin layer;

D) the step of applying light from above the liquid repelling layer through a mask on which a pattern for forming an ink discharge port is depicted;

E) the step of developing the liquid repelling layer and the coat resin layer to which the light has been applied to thereby make them into a liquid repelling layer and a coat resin layer having an ink discharge port at a location above the ink discharge pressure generating element; and F) the step of eluting and removing the resin forming the soluble resin layer to thereby provide an ink flow path.

As an effect of the present invention, there can be provided a pattern forming method which can keep the edge of the opening portion of a pattern in a sharp state and yet, can make the wall surface of the recess of the pattern into a tapered shape. Further, when the present invention is applied to the manufacture of the ink discharge port of an ink jet recording head, an ink discharge port of which the edge of the opening portion is kept in a sharp state and the wall surface assumes a tapered shape becomes formable by a simple method. As a result, there can be provided an ink jet recording head which can obtain an image of high quality and a method of manufacturing the same.

DETAILED DESCRIPTION OF THE PREFERRED EMBODIMENTS

In a conventional pattern forming method, as a method of forming a coat resin layer on a substrate, there is, adopted a method of applying onto the substrate a liquid to be applied comprising a mixture of a photopolymerizable resin and a photopolymerization starting agent by a solvent coating method typified by spin coating or the like, and drying the liquid as required to thereby form film. In this method, as a matter of course, it is difficult to give the density distribution of the photopolymerization starting agent in the direction of film thickness of the coat resin layer, and if a pattern is imaged near the surface of the coat resin layer when the pattern is exposed, the wall surface of the recess of the pattern does not assume a tapered shape.

The inventors have found that it is possible to give a distribution to the density of the photopolymerization starting agent in the direction of film thickness of the coat resin layer by the following method, and have come to the present invention. The method is a method of forming a coat resin layer, for example, in a state not containing a photopolymerization starting agent, and then applying onto the coat resin layer a solution in which a photopolymerization starting agent is dissolved, and permeating and diffusing the photopolymerization starting agent into the coat resin layer.

That is, when light is to be applied from above the coat resin layer through a mask having a pattern depicted thereon, the pattern is imaged near the surface of the coat resin layer. Thereby, the edge of the opening portion of the pattern can be kept in a sharp shape and yet, the wall surface of the recess of the pattern can be made into a tapered shape by the utilization of the difference in reaction rate due to the density distribution of the photopolymerization starting agent in the direction of film thickness of the coat resin layer.

More specifically, the surface side of the coat resin layer becomes high in the density of the photopolymerization starting agent, as compared with the substrate side, and therefore, after the exposure of the pattern, the polymerization rate of a photosensitive resin is high on the surface side of the coat resin layer, and is low on the substrate side. Accordingly, in the developing process thereafter, the developing speed on the surface side of the coat resin layer is low as compared with that on the substrate side, and there can be realized a tapered shape in which the wall surface of the recess of the pattern obtained as the result is tapered toward the opening portion of the pattern. At the same time, during the exposure by photolithography, the pattern is imaged near the surface of the coat resin layer and therefore, the edge of the opening portion of the pattern on the surface of the coat resin layer becomes capable of keeping a sharp shape.

Then, the pattern forming method of the present invention will be described in greater detail with reference to the drawings.

Figure 1A:
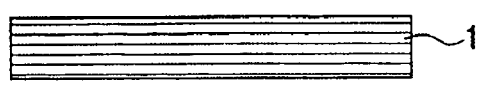
FIGS. 1A, 1B, 1C, 1D and 1E are views for illustrating an embodiment of a pattern forming method according to the present invention, and showing the construction during the formation in time series.

First, as shown in FIG. 1A, a substrate 1 is prepared. As the substrate 1, use can be made, for example, of a silicon substrate, a substrate formed of a metal or a metal oxide, or a substrate formed of a plastic material.

Figure 1B:
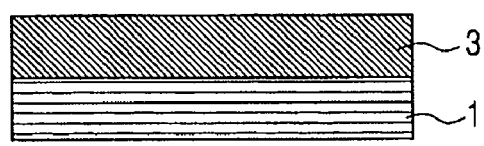

Then, as shown in FIG. 1B, a coat resin layer 3 containing a photopolymerizable resin is formed on the substrate 1. The photopolymerizable resin starts polymerization by the imparting of light energy thereto, and as such resin, use can be made, for example, of a epoxy resin capable of effecting ring-opening polymerization, an oxetane resin, a resin having a thiirane ring, or an acryl resin capable of effecting addition polymerization. This photopolymerizable resin forms a layer providing a pattern after polymerization and therefore, may preferably have necessary mechanical strength, a close contact property with respect to the substrate, etc., and use is suitably be made of an optical cation polymerizing resin, or further an epoxy resin.

Here, it is preferable that at the forming stage of the coat resin layer 3, the coat resin layer 3 do not contain the photopolymerization starting agent. By doing so, as will be described later, it becomes easy to apply a solution 5 containing the photopolymerization starting agent onto the coat resin layer 3, and permeate and diffuse the photopolymerization starting agent into the coat resin layer 3 to thereby give a density distribution in the direction of film thickness of the coat resin layer 3. From that point of view, the photopolymerizable resin may preferably be a resin being in a solid state at an ordinary temperature (25° C.) which can control the permeation and diffusion of the photopolymerization starting agent. Also, at the forming stage of the coat resin layer 3, it is possible for the coat resin layer 3 to contain such a degree, e.g. 0.01 to 1% by mass, as will not hinder a desired density distribution from being given in the direction of film thickness of the coat resin layer 3 at the next step.

The coat resin layer 3 can be suitably formed by spin coating, direct coating or the like. This coat resin layer 3 is usually formed so as to have a thickness of 10 to 100 μm.

Figure 1C:
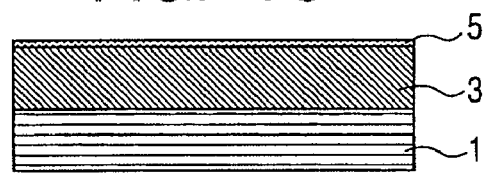

Then, as shown in FIG. 1C, a solution 5 containing the photopolymerization starting agent is applied onto the coat resin layer 3. The solution 5 containing the photopolymerization starting agent can be suitably formed by spin coating, direct coating or the like, and particularly direct coating is preferably used. Here, a heating process is carried out during the application, or as required, after the application, of the solution 5 containing the photopolymerization starting agent, whereby there can be formed a state in which the photopolymerization starting agent has been permeated and diffused into the coat resin layer 3, and the density distribution of the photopolymerization starting agent has been produced in the direction of film thickness of the coat resin layer 3. An area in which the density of the photopolymerization starting agent becomes 0 may be produced in a portion of the coat resin layer 3. Thereafter, any solution residual on the surface of the coat resin layer 3 can be removed by dry, washing or the like, or the solution may remain residual thereon.

As the photopolymerization starting agent, when the pattern formation by photolithography is taken into account, use may preferably be made of an optical cation polymerization starting agent. Mention may be made, for example, of hexafluoroantimonate salt, hexafluorophosphate salt or the like of aromatic sulfonium or aromatic iodonium. This photopolymerization starting agent is permeated and diffused into the coat resin layer 3 and therefore, use may preferably be made of a polarity solvent as required. It may preferably be a polarity solvent having a high boiling point. It may preferably be a polarity solvent selected from a group comprising, for example, propylene carbonate, ethylene carbonate and γ-butyrolactone.

The density of the photopolymerization starting agent in the solution 5 containing the photopolymerization starting agent can be suitably set within a range which can form the desired density distribution of the photopolymerization starting agent in the coat resin layer 3. The range may preferably be 0.5% by mass or greater, and more preferably be 1% by mass or greater, and preferably be 10% by mass or less.

Figure 1D:
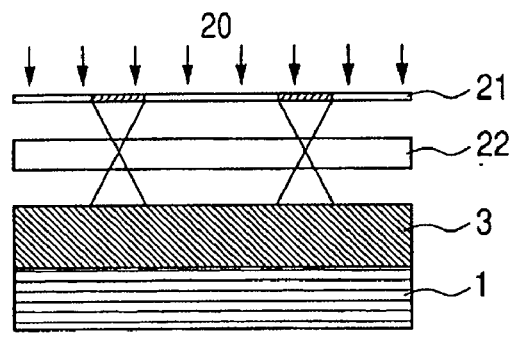

Then, as shown in FIG. 1D, light 20 is applied from above the coat resin layer 3 through a mask 21 having a pattern depicted thereon to thereby effect pattern exposure. At this time, the position at which the pattern is imaged by the light from an exposing machine is suitably adjusted by an imaging optical system 22 so as to be near the surface of the coat resin layer 3.

Figure 1E:
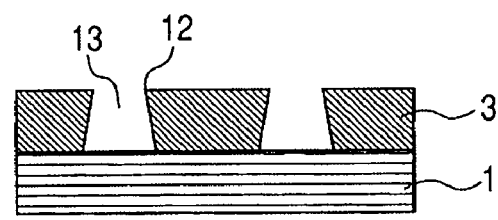

As previously described, the coat resin layer 3 has the density distribution of photopolymerization starting agent in the direction of film thickness thereof and therefore, the polymerization reaction speed differs in the direction of film thickness even if the imaging position is set near the surface. Accordingly, a developing process is carried out to thereby provide a coat resin layer 3 having a predetermined pattern, whereby as shown in FIG. 1E, the wall surface of a pattern recess 13 assumes a tapered shape in which it becomes tapered toward the opening portion. The taper angle of the wall surface of the pattern recess 13 with respect to the substrate 1 can be suitably set in conformity with the purpose of use, and may preferably be 65 to 85° from the ease of formation. The solvent and condition used in the developing process are suitably set so that the wall surface can form a pattern recess 13 having a tapered shape of a desired angle.

Figure 2A:
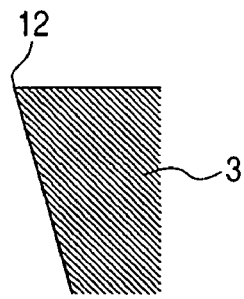
FIGS. 2A, 2B and 2C are enlarged views of the vicinity of the edges of the recesses of formed patterns, FIG. 2A showing the vicinity of the edge of the recess of a pattern formed by the method of the present invention, and FIGS. 2B and 2C showing the vicinity of the edge of the recess of a pattern formed by a conventional method.
Figure 2B:
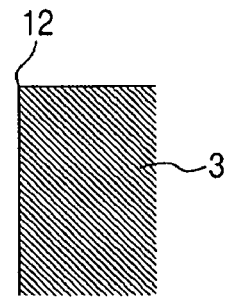
Figure 2C:
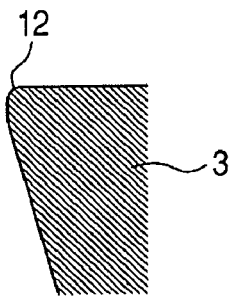

Also, the pattern imaging position is set near the surface of the coat resin layer 3 and therefore, the shape of the edge 12 of the opening portion of the pattern recess 13 can be made sharp as shown in FIG. 2A. In a case where as in the prior art, the coat resin layer 3 contains the photopolymerization starting agent, the photopolymerization starting agent is uniformly distributed in the coat resin layer 3. Therefore, if the pattern imaging position is set near the surface of the coat resin layer 3, it will in some case be difficult to make the wall surface of the pattern recess 13 into a tapered shape, as shown in FIG. 2B. On the other hand, in a method of deviating the pattern imaging position from near the surface of the coat resin layer 3 to thereby make the wall surface of the pattern recess 13 into a tapered shape, the shape of the edge 12 of the opening portion of the pattern recess 13 becomes rounded as shown in FIG. 2C.

The present invention will hereinafter be described in detail with respect to the application thereof to the manufacture of the ink discharge port of an ink jet recording head.

For example, in the method of Japanese Patent Application Laid-open No. H06-286149 which is a conventional method, an ink discharge port is formed in a coat resin layer formed by a liquid to be applied comprising a mixture of at least a photopolymerizable resin and a photopolymerization starting agent having been formed into film on a substrate by solvent coating. In this method, the photopolymerizable resin and the photopolymerization starting agent are mixed together and therefore, it is difficult in principle to give the density distribution of the photopolymerization starting agent in the direction of film thickness of the coat resin layer during solvent coating.

So, the inventors formed a coat resin layer, for example, in a state not containing a photopolymerization starting agent, caused a liquid repelling layer formed on the coat resin layer to contain the photopolymerization starting agent, and permeated and diffused the photopolymerization starting agent from the liquid repelling layer into the coat resin layer. Thereby, they have found that a distribution can be given to the density of the photopolymerization starting agent in the direction of film thickness of the coat resin layer. That is, the photopolymerization starting agent exists at high density on the surface side (the liquid repelling layer side) of the coat resin layer, and exists at low density on the substrate side thereof. In the above-described construction, when an ink discharge port is to be formed, even in exposure with a pattern imaged near the surface of the coat resin layer (near the surface of the liquid repelling layer), there is the density distribution of the photopolymerization starting agent in the direction of film thickness of the coat resin layer and therefore, it becomes possible to make the wall surface of the ink discharge port into a tapered shape.

More specifically the nearer to the surface of the coat resin layer (the liquid repelling layer side), the higher is the density of the photopolymerization starting agent and therefore, the more progresses polymerization reaction. As the result, in the developing process thereafter, the developing speed on the surface side of the coat resin layer is low as compared with that on the substrate side, and there can be realized a tapered shape in which the wall surface becomes tapered toward the surface of the coat resin layer (the surface of the liquid repelling layer). At the same time, in the present invention, during the exposure by photolithography, a pattern is imaged near the surface of the coat resin layer (near the surface of the liquid repelling layer) to thereby form an ink discharge port and therefore, it becomes possible for the edge of the opening portion of the ink discharge port in the surface of the coat resin layer (the surface of the liquid repelling layer) to keep a sharp shape.

The force with which ink is held in the ink discharge port depends strongly on the liquid repelling performance of the surface and the shape of the surface portion of the ink discharge port and therefore, by keeping this holding force strong, it is possible to suppress meniscus vibration when ink discharge is effected at a high driving frequency, and obtain an image of high quality.

A method of manufacturing the ink jet recording head of the present invention will now be described in greater detail with reference to the drawings.

Figure 3A:
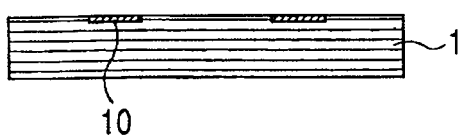
FIGS. 3A, 3B, 3C, 3D, 3E, 3F and 3G are views for illustrating an embodiment of a method of manufacturing an ink jet recording head according to the present invention, and showing the construction during the manufacture in time series.

First, as shown in FIG. 3A, a substrate 1 on which ink discharge pressure generating elements 10 comprising electro-thermal transducing elements are formed is prepared. As the substrate 1, use can be made, for example, of a silicon substrate. The number of the ink discharge pressure generating elements 10 formed on the substrate 1 may be one or more.

Figure 3B:
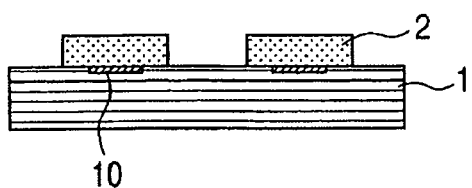

Then, as shown in FIG. 3B, a soluble resin layer 2 is formed on the substrate 1. It is to be understood that at this time, the soluble resin layer 2 has a pattern which will later provide an ink flow path. The soluble resin layer 2 may preferably be formed by the use of a positive type resist, particularly a photodecomposable type positive type resist relatively high in molecular weight so that shape destruction may not occur during the lamination of the coat resin layer. As such resin, use can be made of polymethyl isopropenyl ketone, polyalkyl methacrylate or a copolymer thereof. Then, pattern exposure is done to thereby form a pattern which provides the above-mentioned ink flow path. This soluble resin layer 2 is usually formed so as to have a thickness of 10 to 60 μm.

Figure 3C:
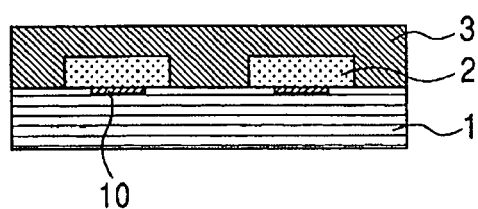

Then, as shown in FIG. 3C, a coat resin layer 3 containing a photopolymerizable resin (i) is formed on the substrate 1 on which the soluble resin layer 2 has been formed. The photopolymerizable resin (i) starts polymerization by the imparting of light energy thereto, and as this resin, use can be made, for example, of an epoxy resin capable of effecting ring-opening polymerization, an oxetane resin, a resin having a thiiran ring, or an acryl resin capable of effecting addition polymerization. This resin (i) provides the wall of the ink discharge port after polymerization and therefore, should preferably have mechanical strength necessary as the ink discharge port, a close contact property with respect to the substrate, and the resistance to the ink, and use may preferably be made of a resin having optical cation polymerizability, or further an epoxy resin.

Here, it is preferable that at the forming stage of the coat resin layer 3, the coat resin layer 3 does not contain the photopolymerization starting agent. By doing so, as will be described later, it becomes easy to cause the photopolymerization starting agent to be contained in a liquid repelling layer 4 formed on the coat resin layer 3, and permeate and diffuse the photopolymerization starting agent from the liquid repelling layer 4 into the coat resin layer 3 to thereby give a density distribution in the direction of film thickness of the coat resin layer 3. From that point of view, the photopolymerizable resin (i) should preferably be a resin being in a solid state at an ordinary temperature (25° C.) which can control the permeation and diffusion of the photopolymerization starting agent. Also, at the forming stage of the coat resin layer 3, it is possible to cause such a degree, e.g., 0.01-1% by mass, of photopolymerization starting agent as will not hinder a desired density distribution from being given in the direction of film thickness of the coat resin layer 3 at the next step to be contained.

The coat resin layer 3 can be suitably formed by spin coating, direct coating or the like. This coat resin layer 3 is usually formed on the soluble resin layer 2 so as to have a thickness of 10-100 μm.

Figure 3D:
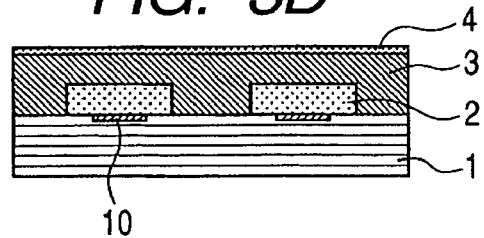

Then, as shown in FIG. 3D, a liquid repelling layer 4 containing a photopolymerizable resin (ii) and a photopolymerization starting agent is formed on the coat resin layer 3. The liquid repelling layer 4 can be suitably formed by spin coating, direct coating or the like, and particularly may be formed preferably by direct coating. Here, a heating process is carried out during the formation, or as required, after the formation, of the liquid repelling layer 4, whereby there can be formed a state in which the photopolymerization starting agent present in the liquid repelling layer 4 has been permeated and diffused into the coat resistance layer 3 to thereby produce the density distribution of the photopolymerization starting agent in the direction of film thickness of the coat resin layer 3. An area in which the density of the photopolymerization starting agent is 0 may be produced in a portion of the coat resin layer 3. The liquid repelling layer 4 is usually formed so as to have a thickness of 0.1 to 1 μm.

The photopolymerizable resin (ii) is required to have a sufficient liquid repelling property and a close contact property with respect to the coat resin layer 3, and a compound having cation polymerizability is preferably used as this resin. Specifically, a photosensitive compound or the like containing alkylsilane fluoride may be mentioned. Particularly, use may more preferably be made of the condensate of a hydrolysable silane compound having a fluorine containing group, and a hydrolysable silane compound having a cation-polymerizable group.

As the photopolymerization starting agent, when the formation of the ink discharge port by photolithography is taken into account, an optical cation polymerization starting agent is preferably used. Mention may be made, for example, of the hexafluoroantimonate salt, hexafluorophosphate salt, etc. of aromatic sulfonium and aromatic iodonium. It is preferable that this photopolymerization starting agent, in order to be permeated and diffused from the liquid repelling layer 4 into the coat resin layer 3, exists in the liquid repelling layer 4 in a state in which it is dissolved in a polarity solvent, as required. The polarity solvent should preferably be a polarity solvent having a high boiling point. Preferable is for example, a polarity solvent selected from a group comprising a propylene carbonate, ethylene carbonate and γ-butyrolactone.

In the present invention, in order to supply the photopolymerization starting agent from the liquid repelling layer 4 to the coat resin layer 3, it is preferable that the photopolymerization starting agent be contained in the liquid repelling layer 4 at higher density than usual. Although depending on embodiments, the density of the photopolymerization starting agent in a composition used when the liquid repelling layer 4 is formed may preferably be 5% by mass or greater, and more preferably be 10% by mass or greater, and preferably be 40% by mass or less.

Figure 3E:
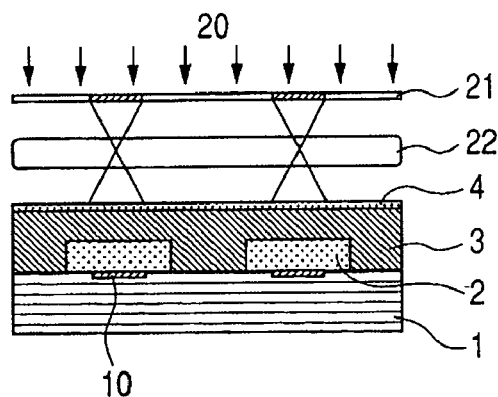

Then, as shown in FIG. 3E, light 20 is applied from above the liquid repelling layer 4 through a mask 21 on which a pattern for forming the ink discharge port is depicted to thereby effect pattern exposure. At this time, the position at which the pattern is imaged by the light from an exposing machine is suitably adjusted by an imaging optical system 22 so as to be near the surface of the liquid repelling layer 4 or near the surface of the coat resin layer 3. Generally the liquid repelling layer 4 is formed very thinly as compared with the coat resin layer 3 and therefore, whether the imaging position is near the surface of the liquid repelling layer 4 or near the surface of the coat resin layer 3, the shapes of the obtained ink discharge ports 11 are substantially the same.

Figure 3F:
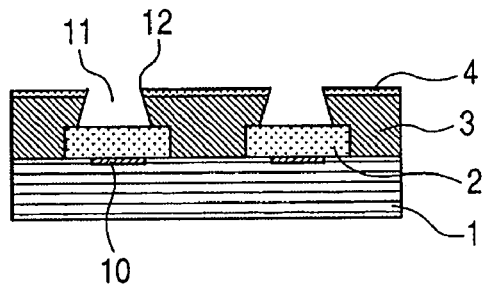

As previously described, the coat resin layer 3 has the density distribution of the photopolymerization starting agent in the direction of film thickness thereof and therefore, even if the imaging position is set near the surface thereof, the polymerization reaction speed differs in the direction of film thickness thereof. Accordingly, a developing process is carried out to thereby provide a liquid repelling layer 4 and a coat resist layer 3 having the ink discharge port 11 at a location above the ink discharge pressure generating elements 10, whereby as shown in FIG. 3F, the wall surface of the ink discharge port 11 assumes a tapered shape in which it is tapered toward the opening portion. The taper angle of the wall surface of the ink discharge port 11 with respect to the substrate 1 may preferably be 65-85° from the viewpoint of ink discharging performance. A solvent and a condition used in the developing process are suitably set so that an ink discharge port 11 of which the wall surface has a tapered shape of a desired angle can be formed.

Figure 4A:
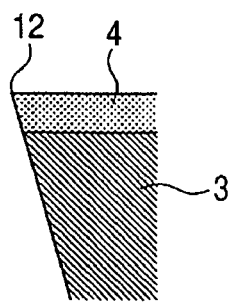
FIGS. 4A, 4B and 4C are enlarged views of the vicinity of the edges of the opening portions of the ink discharge ports of ink jet recording heads, FIG. 4A showing the vicinity of the edge of the opening portion of an ink discharge port formed by the method of the present invention, and FIGS. 4B and 4C showing the vicinity of the edge of the opening by a conventional method.
Figure 4B:
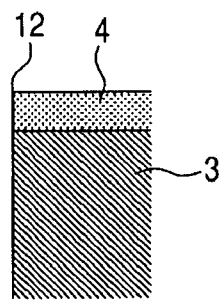
Figure 4C:
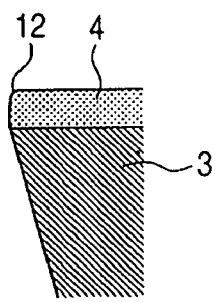

Also, since the pattern imaging position is set near the surface of the liquid repelling layer 4 or near the surface of the coat resin layer 3, the shape of the edge 12 of the opening portion of the ink discharge port 11 can be made sharp as shown in FIG. 4A. When as in the prior art, the coat resin layer 3 contains the photopolymerization starting agent, the photopolymerization starting agent is uniformly distributed in the coat resin layer 3. As shown in FIG. 4B, there is a case where it is difficult to make the wall surface of the ink discharge port 11 into a tapered shape, if the pattern imaging position is set near the surface of the liquid repelling layer 4 or near the surface of the coat resin layer 3. On the other hand, in a method of deviating the pattern imaging position from near the surface of the liquid repelling layer 4 or near the surface of the coat resin layer 3 to thereby make the wall surface of the ink discharge port 11 into a tapered shape, the shape of the edge 12 of the opening portion of the ink discharge port becomes rounded, as shown in FIG. 4C.

Figure 3G:
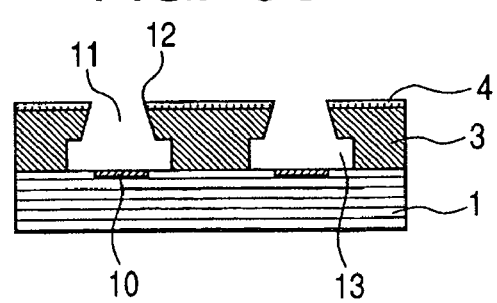

Then, the resin forming the soluble resin layer 2 is eluted and removed to thereby provide an ink flow path 13 as shown in FIG. 3G. A solvent for eluting the above-mentioned resin can be suitably determined in conformity with the kind of resin. Then, an ink supply port, not shown, is suitably formed, thus completing an ink jet recording head. It is also possible to elute and remove the resin forming the soluble resin layer 2 after the ink supply port has been formed.

Embodiment

A more specific embodiment of the present invention will now be described. In this embodiment, an ink jet recording head was made in accordance with the procedure shown in FIGS. 3A to 3G.

First, as a soluble resin layer, polymethyl isopropenyl ketone (ODUR-1010 (trade name), produced by Tokyo Oka Kogyo Co., Ltd.) was applied onto and formed into film by spin coating on a silicon substrate on which an electro-thermal transducing element as an ink discharge pressure generating element is formed. Then, it was prebaked at 120° C. for 6 minutes, whereafter pattern exposure for forming a pattern providing an ink flow path was effected by a mask aligner UX3000 (trade name) produced by Ushio Denki Co., Ltd. The exposure was effected for 3 minutes, whereafter development was effected by the use of a mixed solvent of methyl isobutyl ketone (MIBK)/xylene=2/1 (mass ratio), and rinse was effected with xylene The aforementioned polymethyl isopropenyl ketone is a so-called positive type resist which is decomposed by UV irradiation and becomes soluble by an organic solvent. That is, the pattern formed on the soluble resin layer is formed by a portion which is not exposed during the pattern exposure, and is for securing an ink flow path. The film thickness of the above-mentioned soluble resin layer after the development was 17 μm.

Then, an optical cation polymerizable resin of a composition shown in Table 1 below was dissolved in a mixed solvent of methyl isobutyl ketone/diglyme (1/1 (mass ratio)) at density of 60% by mass, was applied, by spin coating, onto a silicon substrate on which a soluble resin layer is formed, and was prebaked at 90° C. for 4 minutes. The above-mentioned application and prebaking were effected twice to thereby form a coat resin layer having a film thickness of 40 μm on the soluble resin layer. The epoxy resin shown in Table 1 is a solid-state epoxy resin having a fusing point of about 80° C. Also, at this stage, a photopolymerization starting agent is not contained in the coat resin layer.

TABLE 1

| epoxy resin | EHPE-3150(trade name) produced by Diecell Kagaku Co., Ltd. | 100 parts by mass |
|---|---|---|
| additive | 1.4-HFAB(trade name) produced by Central Glass Co., Ltd. | 20 parts by mass |
| silane coupling agent | A-187(trade name) produced by Nippon Unicar Co., Ltd. | 5 parts by mass |

* 1.4-HFAB: (1.4-bis(2-hydroxyhexafluoroisopropyl)benzene)

Then, there was prepared an ethanol solution of 10% by mass having a composition in which as an optical cation polymerization starting agent, aromatic sulfonium hexafluoroantimonate salt (trade name: SP170, produced by Asahi Denka Kogyo Co., Ltd.) was added at a percentage of 15% by mass to a hydrolysable condensation product of glycidylpropyltri-ethoxysilane, methyltriethoxysilane and tridecafluoro-1,1,2,2-tetrahydroctyl-triethoxysilane. Then, the aforementioned ethanol solution was applied onto the coat resin layer by a direct coating method, and prebaking was effected at 90° C. for 1 minute to thereby form a liquid repelling layer having a film thickness of 0.5 μm.

Then, pattern exposure for forming a pattern providing an ink discharge part was effected by the use of a mask aligner "MPA600 Super (trade name)" produced by Canon Inc. Here, the imaging position was set on the surface of the liquid repelling layer. Next, heating was effected at 90° C. for 4 minutes, development was effected with a mixed solvent of methyl isobutyl ketone/xylene=2/3 (mass ratio), and rinse was effected with isopropyl alcohol to thereby form a pattern providing an ink discharge port. Here, the coat resin layer other than the portion providing the ink discharge port was hardened by the optical cation polymerization starting agent, and the shape of the edge of the opening portion of the obtained ink discharge port was sharp, and the wall surface of the ink discharge port assumed a tapered shape. The taper angle of the wall surface of the ink discharge port with respect to the substrate was 750°.

Then, an ink supply port was formed in the back of the substrate and further, the soluble resin layer providing an ink flow path was removed.

Then, an overheating process was carried out at 200° C. for 1 hour to thereby completely harden the coat resin layer and the liquid repelling layer, and lastly, an ink supplying member was adhesively secured to the ink supply port to thereby complete an ink jet recording head.

When the thus obtained ink jet recording head was filled with ink BCI-3Bk (trade name) produced by Canon Inc. and printing was effected, the obtained images were of a high quality.

This application claims priority from Japanese Patent Application No. 2004-356784 filed Dec. 9, 2004, which is hereby incorporated by reference herein.

What is claimed is:

1. A pattern forming method of forming a layer having a pattern on a substrate, comprising:
   a) a step of forming a coat resin layer containing a photopolymerizable resin on said substrate;
   b) a step of applying a solution containing a photopolymerization starting agent onto said coat resin layer, and forming a concentration gradient of the photopolymerization starting agent in the direction of film thickness of said coat resin layer, such that the concentration of the photopolymerization starting agent is lower at a substrate side of the coat resin layer than at a side of the coat resin layer that is opposite the substrate side thereof in the film thickness direction;

c) a step of applying light from above said coat resin layer through a mask having a pattern depicted thereon; and d) a step of developing said coat resin layer to which the light has been applied to thereby make it into a coat resin layer having said pattern.

2. A pattern forming method according to claim 1, wherein the application at said step b) is effected by a direct coating method.

3. A pattern forming method according to claim 1, wherein the photopolymerization resin is a compound that is in a solid state at an ordinary temperature.

4. A pattern forming method according to claim 1, wherein said coat resin layer contains a cation-polymerizable compound, and said photopolymerization starting agent is an optical cation polymerization starting agent.

5. A method of manufacturing an ink jet recording head, comprising:

A) a step of forming, on a substrate having an ink discharge pressure generating element formed thereon, a soluble resin layer having a pattern providing an ink flow path;

B) a step of forming a coat resin layer containing a photopolymerizable resin (i) on the substrate on which said soluble resin layer has been formed;

C) a step of forming a liquid repelling layer containing a photopolymerizable resin (ii) and a photopolymerization starting agent on said coat resin layer, and forming a concentration gradient of the photopolymerization starting agent in the direction of film thickness of said coat resin layer, such that the concentration of the photopolymerization starting agent is lower at a substrate side of the coat resin layer than at a side of the coat resin layer that is opposite the substrate side thereof in the film thickness direction;

D) a step of applying light from above said liquid repelling layer through a mask on which a pattern for forming an ink discharge port is depicted;

E) a step of developing said liquid repelling layer and said coat resin layer to which the light has been applied to thereby make them into a liquid repelling layer and a coat resin layer having an ink discharge port at a location above said ink discharge pressure generating element; and F) a step of eluting and removing a resin forming said soluble resin layer to thereby provide an ink flow path.

6. A method according to claim 5, wherein each of said coat resin layer and said liquid repelling layer contains a cation-polymerizable compound, and said photopolymerization starting agent is an optical cation polymerization starting agent.

7. A method according to claim 5, wherein the photopolymerizable resin (i) is an epoxy compound that is in a solid state at an ordinary temperature.

8. A method according to claim 5, wherein said liquid repelling layer contains the condensate of a hydrolysable silane compound having a fluorine containing group, and a hydrolysable silane compound having a cation-polymerizable group.

9. A method according to claim 5, wherein the formation of the liquid repelling layer at said step C) is effected by a direct coating method.

10. A method according to claim 5, wherein said photopolymerization starting agent exists in a state dissolved in a polar solvent in said liquid repelling layer.

11. A method according to claim 10, wherein said polar solvent is selected from the group consisting of propylene carbonate, ethylene carbonate and γ-butyrolactone.

* * * * *

UNITED STATES PATENT AND TRADEMARK OFFICE
CERTIFICATE OF CORRECTION

| | |
|---|---|
| PATENT NO. | : 7,282,243 B2 |
| APPLICATION NO. | : 11/295553 |
| DATED | : October 16, 2007 |
| INVENTOR(S) | : Ohkuma et al. |

It is certified that error appears in the above-identified patent and that said Letters Patent is hereby corrected as shown below:

<u>COLUMN 1</u>:
Line 15, "As" should read --As a--.
Line 65, "tend" should read --tends--.

<u>COLUMN 2</u>:
Line 10, "afore described" should read --aforedescribed--.
Line 15, "substrate:" should read --substrate;--.

<u>COLUMN 3</u>:
Line 30, "is," should read --is--.

<u>COLUMN 4</u>:
Line 10, "Then," should read --Next,--.
Line 21, "a" should read --an--.
Line 31, "do" should read --does--.
Line 44, "e.g." should read --e.g.,--.

<u>COLUMN 5</u>:
Line 2, "dry, washing" should read --dry washing--.
Line 44, "from" should read --for--.
Line 57, "case" should read --cases--.

<u>COLUMN 6</u>:
Line 36, "the more progresses" should read --more quickly progresses the--.

UNITED STATES PATENT AND TRADEMARK OFFICE
CERTIFICATE OF CORRECTION

PATENT NO. : 7,282,243 B2
APPLICATION NO. : 11/295553
DATED : October 16, 2007
INVENTOR(S) : Ohkuma et al.

It is certified that error appears in the above-identified patent and that said Letters Patent is hereby corrected as shown below:

COLUMN 7:
Line 63, "resistance" should read --resin--.

COLUMN 9:
Line 49, "xylene" should read --xylene.--.

COLUMN 10:
Line 27, "part" should read --port--.
Line 41, "750°." should read --75°.--.

Signed and Sealed this

Third Day of March, 2009

JOHN DOLL
*Acting Director of the United States Patent and Trademark Office*